United States Patent
Kataoka (10) Patent No.: US 11,837,442 B2
(45) Date of Patent: Dec. 5, 2023

(54) PLASMA PROCESSING APPARATUS AND SUBSTRATE SUPPORTER

(71) Applicant: TOKYO ELECTRON LIMITED, Tokyo (JP)

(72) Inventor: Eitaro Kataoka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 98 days.

(21) Appl. No.: 17/679,518

(22) Filed: Feb. 24, 2022

(65) Prior Publication Data

US 2022/0270854 A1    Aug. 25, 2022

(30) Foreign Application Priority Data

Feb. 25, 2021    (JP) .................. 2021-029021

(51) Int. Cl.
   *H01J 37/32*    (2006.01)
(52) U.S. Cl.
   CPC .... *H01J 37/3244* (2013.01); *H01J 37/32568* (2013.01); *H01J 37/32715* (2013.01)
(58) Field of Classification Search
   CPC ............. H01J 37/3244; H01J 37/32568; H01J 37/32715
   See application file for complete search history.

(56) References Cited

U.S. PATENT DOCUMENTS

2021/0242063 A1*  8/2021  Wakabayashi .... H01J 37/32715

FOREIGN PATENT DOCUMENTS

| JP | H6-244119 A | 9/1994 |
| JP | 2001-356531 A | 12/2004 |
| JP | 2013-149865 A | 8/2013 |

\* cited by examiner

*Primary Examiner* — Henry Luong
(74) *Attorney, Agent, or Firm* — Nath, Goldberg & Meyer; Jerald L. Meyer; Tanya E. Harkins (57) ABSTRACT

A plasma processing apparatus includes a process container, an electrode arranged inside the process container and applied with desired high frequency power, a member having the electrode, and an embedded member arranged in the member. The embedded member is composed of a first member formed with one or more outer flow paths on an outer periphery of the embedded member, and a second member formed with one or more inner flow paths connected to the one or more outer flow paths by joining with the first member. The one or more outer flow paths and the one or more inner flow paths communicate with each other.

7 Claims, 7 Drawing Sheets

PLASMA PROCESSING APPARATUS AND SUBSTRATE SUPPORTER

CROSS-REFERENCE TO RELATED APPLICATION

This application is based upon and claims the benefit of priority from Japanese Patent Application No. 2021-029021, filed on Feb. 25, 2021, the entire contents of which are incorporated herein by reference.

TECHNICAL FIELD

The present disclosure relates to a plasma processing apparatus and a substrate supporter.

BACKGROUND

For example, Patent Document 1 discloses that a plurality of gas flow path members having different configurations are stacked and arranged in a gas introduction pipe penetrating a substrate supporter in order to prevent abnormal discharging from occurring in the gas introduction pipe. Patent Document 2 discloses a gas flow path member that prevents charged particles from entering a buffer chamber of an upper electrode to cause abnormal discharging. Patent Document 3 discloses a gas flow path member that prevents abnormal discharging from occurring in the vicinity of an upper electrode in an apparatus by applying a DC voltage to the upper electrode.

PRIOR ART DOCUMENTS

Patent Documents

Patent Document 1: Japanese Laid-Open Patent Publication No. H06-244119
Patent Document 2: Japanese Laid-Open Publication No. 2004-356531
Patent Document 3: Japanese Laid-Open Publication No. 2013-149865

SUMMARY

According to one embodiment of the present disclosure, there is provided a plasma processing apparatus including: a process container; an electrode arranged inside the process container and applied with desired high frequency power; a member having the electrode; and an embedded member arranged in the member, wherein the embedded member is composed of: a first member formed with one or more outer flow paths on an outer periphery of the embedded member; and a second member formed with one or more inner flow paths connected to the one or more outer flow paths by joining with the first member, and wherein the one or more outer flow paths and the one or more inner flow paths communicate with each other.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Hereinafter, embodiments for carrying out the present disclosure will be described with reference to the drawings. Throughout the drawings, the same components may be denoted by the same reference numerals, and explanation thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Plasma Processing System]

Figure 1:
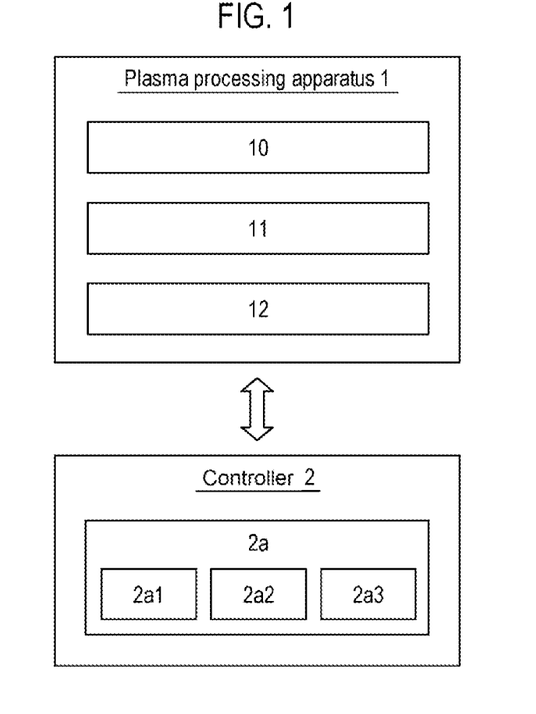
FIG. 1 is a schematic cross-sectional view showing an example of a plasma processing system according to an embodiment.

A configuration example of a plasma processing system shown in FIG. 1 will be described below. In an embodiment, the plasma processing system includes a plasma processing apparatus 1 and a controller 2. The plasma processing apparatus 1 includes a plasma process chamber 10 (also referred to as a process container), a substrate supporter 11, and a plasma generator 12. The plasma process chamber 10 has a plasma processing space. Further, the plasma process chamber 10 includes at least one gas supply port for supplying at least one process gas into the plasma processing space, and at least one gas discharge port for discharging a gas from the plasma processing space. The gas supply port is connected to a gas supplier 20 to be described later, and the gas discharge port is connected to an exhaust system 40 to be described later. The substrate supporter 11 is arranged inside the plasma processing space and has a substrate support surface for supporting a substrate.

The plasma generator 12 is configured to generate plasma from the at least one process gas supplied into the plasma processing space. The plasma formed in the plasma processing space may be capacitively-coupled plasma (CCP), inductively-coupled plasma (ICP), ECR (Electron-Cyclotron-Resonance) plasma, HWP (Helicon Wave Plasma), SWP (Surface Wave Plasma), or the like. Further, various types of plasma generators including an AC (Alternating Current) plasma generator and a DC (Direct Current) plasma generator may be used. In an embodiment, an AC signal (AC power) used in the AC plasma generator has a frequency in a range of 100 kHz to 10 GHz. Therefore, the AC signal includes an RF (Radio Frequency) signal and a microwave signal. In an embodiment, the RF signal has a frequency in a range of 200 kHz to 150 MHz.

The controller 2 processes computer-executable instructions that cause the plasma processing apparatus 1 to perform various steps described in the present disclosure. The controller 2 may be configured to control each element of the plasma processing apparatus 1 so as to perform the various steps described herein. In an embodiment, a portion or all of the controller 2 may be included in the plasma processing apparatus 1. The controller 2 may include, for example, a computer 2a. The computer 2a may include, for example, a processing part (CPU: Central Processing Unit) 2a1, a storage part 2a2, and a communication interface 2a3. The processing part 2a1 may be configured to perform various control operations based on programs stored in the storage part 2a2. The storage part 2a2 may include a RAM (Random Access Memory), a ROM (Read Only Memory), an HDD (Hard Disk Drive), an SSD (Solid State Drive), or a combination thereof. The communication interface 2a3 may communicate with the plasma processing apparatus 1 via a communication line such as a LAN (Local Area Network).

Figure 2:
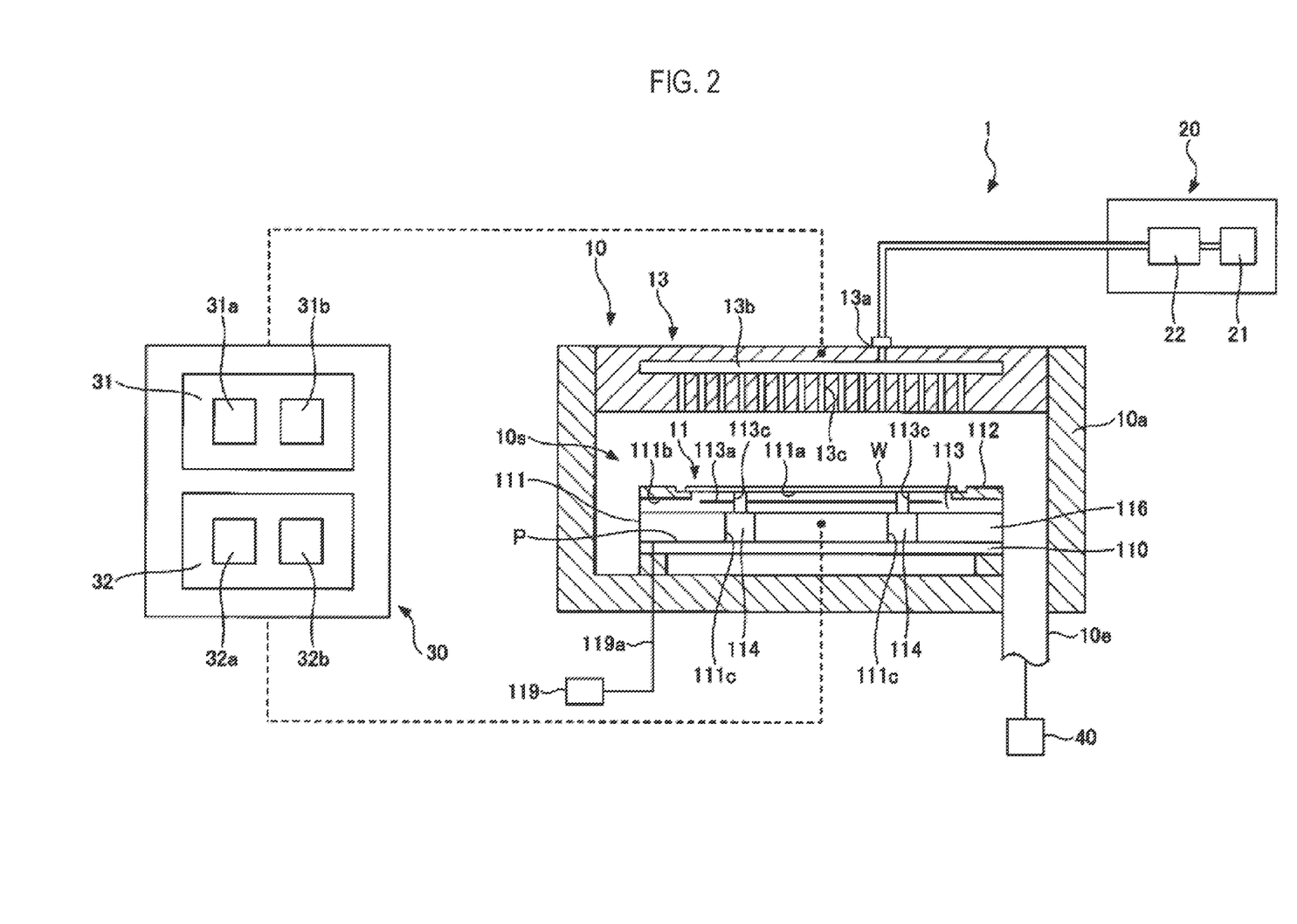
FIG. 2 is a view showing an example of a plasma processing apparatus according to an embodiment.

Next, a configuration example of a capacitively-coupled plasma processing apparatus as an example of the plasma processing apparatus 1 will be described with reference to FIG. 2. The plasma processing apparatus 1 includes the plasma process chamber 10, the gas supplier 20, a power supply 30, and the exhaust system 40. Further, the plasma processing apparatus 1 includes the substrate supporter 11 and a gas introduction part. The gas introduction part is configured to introduce at least one process gas into the plasma process chamber 10. The gas introduction part includes a shower head 13. The substrate supporter 11 is arranged inside the plasma process chamber 10. The shower head 13 is arranged above the substrate supporter 11. In an embodiment, the shower head 13 constitutes at least a portion of the ceiling of the plasma process chamber 10. The plasma process chamber 10 has a plasma processing space 10s defined by the shower head 13, a sidewall 10a of the plasma process chamber 10, and the substrate supporter 11. The sidewall 10a is grounded. The shower head 13 and the substrate supporter 11 are electrically insulated from a housing of the plasma process chamber 10.

The substrate supporter 11 includes a main body 11 and a ring assembly 112. The main body 111 has a central region (substrate support surface) 111a for supporting a substrate (wafer) W, and an annular region (ring support surface) 111b for supporting the ring assembly 112. The annular region 111b of the main body 111 surrounds the central region 111a of the main body 111 in a plan view. The substrate W is arranged on the central region 111a of the main body 111, and the ring assembly 112 is arranged on the annular region 111b of the main body 111 so as to surround the substrate W on the central region 111a of the main body 111. In an embodiment, the main body 111 includes a base 116 (also referred to as a lower electrode) and an electrostatic chuck 113. The base 116 includes a conductive member. The conductive member of the base 116 functions as the lower electrode. The electrostatic chuck 113 is arranged on the base 116. An upper surface of the electrostatic chuck 113 has the substrate support surface 111a. The ring assembly 112 includes one or more annular members. At least one of the one or more annular members is an edge ring. Further, although not shown, the substrate supporter 11 may include a temperature adjusting module configured to adjust at least one of the electrostatic chuck 113, the ring assembly 112, and the substrate to a target temperature. The temperature adjusting module may include a heater, a heat transfer medium, a flow path, or a combination thereof. A heat transfer fluid such as brine or gas flows through the flow path. Further, as will be described later, the substrate supporter 11 is configured to supply a heat transfer gas between a back surface of the substrate W and the substrate support surface 111a.

The shower head 13 is configured to introduce at least one process gas from the gas supplier 20 into the plasma processing space 10s. The shower head 13 has at least one gas supply port 13a, at least one gas diffusion chamber 13b, and a plurality of gas introduction ports 13c. The process gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. In addition to the shower head 13, the gas introduction part may include one or more side gas injection parts (SGIs: Side Gas Injectors) attached to one or more openings formed in the sidewall 10a.

The gas supplier 20 may include at least one gas source 21 and at least one flow rate controller 22. In an embodiment, the gas supplier 20 is configured to supply at least one process gas from the corresponding gas source 21 to the shower head 13 via the corresponding flow rate controller 22. Each flow rate controller 22 may include, for example, a mass flow controller or a pressure-controlled flow rate controller. Further, the gas supplier 20 may include at least one flow rate modulation device that modulates or pulses a flow rate of at least one process gas.

The power supply 30 includes an RF power supply 31 coupled to the plasma process chamber 10 via at least one impedance matching circuit. The RF power supply 31 is configured to supply at least one RF signal (RF power) such as a source RF signal and a bias RF signal to the conductive member of the substrate supporter 11 and/or the conductive member of the shower head 13. As a result, plasma is formed from at least one process gas supplied into the plasma processing space 10s. Therefore, the RF power supply 31 can function as at least a portion of the plasma generator 12. Further, by supplying the bias RF signal to the conductive member of the substrate supporter 11, a bias potential is generated in the substrate W, so that ionic components in the formed plasma can be drawn into the substrate W.

In an embodiment, the RF power supply 31 includes a first RF generator 31a and a second RF generator 31b. The first RF generator 31a is configured to be coupled to the conductive member of the substrate supporter 11 and/or the conductive member of the shower head 13 via at least one impedance matching circuit so as to generate the source RF signal (source RF power) for plasma generation. In an embodiment, the source RF signal has a frequency in a range of 13 MHz to 150 MHz. In an embodiment, the first RF generator 31a may be configured to generate a plurality of source RF signals having different frequencies. The generated one or more source RF signals are supplied to the conductive member of the substrate supporter 11 and/or the conductive member of the shower head 13. The second RF generator 31b is configured to be coupled to the conductive member of the substrate supporter 11 via at least one impedance matching circuit so as to generate the bias RF signal (bias RF power). In an embodiment, the bias RF signal has a lower frequency than the source RF signal. In an embodiment, the bias RF signal has a frequency in a range of 400 kHz to 13.56 MHz. In an embodiment, the second RF generator 31b may be configured to generate a plurality of bias RF signals having different frequencies. The generated one or more bias RF signals are supplied to the conductive member of the substrate supporter 11. Further, in various embodiments, at least one of the source RF signal and the bias RF signal may be pulsed.

Further, the power supply 30 may include a DC power supply 32 coupled to the plasma process chamber 10. The DC power supply 32 includes a first DC generator 32a and a second DC generator 32b. In an embodiment, the first DC generator 32a is configured to be connected to the conductive member of the substrate supporter 11 so as to generate a first DC signal. The generated first DC signal is applied to the conductive member of the substrate supporter 11. In an embodiment, the first DC signal may be applied to another electrode such as an electrode 113a inside the electrostatic chuck 113. In an embodiment, the second DC generator 32b is configured to be connected to the conductive member of the shower head 13 so as to generate a second DC signal. The generated second DC signal is applied to the conductive member of the shower head 13. In various embodiments, the first and second DC signals may be pulsed. Further, the first and second DC generators 32a and 32b may be provided in addition to the RF power supply 31, or the first DC generator 32a may be provided in place of the second RF generator 31b.

The exhaust system 40 may be connected to, for example, a gas discharge port 10e provided at the bottom of the plasma process chamber 10. The exhaust system 40 may include a pressure regulating valve and a vacuum pump. An internal pressure of the plasma processing space 10s is adjusted by the pressure adjusting valve. The vacuum pump may include a turbo molecular pump, a dry pump, or a combination thereof.

[Gas Flow Path]

The electrostatic chuck 113 is provided with the electrode 113a. The electrode 113a is connected to the first DC generator 32a, and is applied with the first DC signal (DC voltage) from the first DC generator 32a. As a result, the substrate W is attracted to and held by the electrostatic chuck 113.

The substrate supporter 11 is an example of a member having an electrode to which desired high frequency power is applied. However, the substrate supporter 11 may not be provided with the electrostatic chuck 113 and the electrode 113a. As the electrode included in the substrate supporter 11, the conductive member of the base 116 to which at least one RF signal (RF power) is coupled from the first RF generator 31a and/or the second RF generator 31b may be used as an electrode (lower electrode).

In the present disclosure, a helium (He) gas is supplied as an example of the heat transfer gas between the substrate support surface 111a of the electrostatic chuck 113 and the back surface of the substrate W. However, the heat transfer gas is not limited to the helium gas, but may be other inert gases. The electrostatic chuck 113 has a plurality of through-holes 113c penetrating in a thickness direction thereof. However, the number of through-holes 113c is not limited thereto, and the electrostatic chuck 113 may be provided with one or more through-holes 113c. The base 116 has a plurality of through-holes 111c penetrating in a thickness direction thereof. However, the number of through-holes 111c is not limited thereto, and the base 116 may be provided with one or more through-holes 111c. The through-holes 111c are provided under the through-holes 113c, and the through-holes 111c and the through-holes 113c communicate with each other to form a flow path for the helium gas.

The main body 111 includes a conductive plate 110 that supports the base 116 under the base 116. There is a gap between a lower surface of the base 116 and an upper surface of the plate 110, which serves as a gas flow path P. The through-holes 111c communicate with the gas flow path P. The gas flow path P is connected to a heat transfer gas supplier 119 via a heat transfer gas supply line 119a. The helium gas supplied from the heat transfer gas supplier 119 flows through the gas flow path P through the heat transfer gas supply line 119a and is supplied between the substrate support surface 111a and the back surface of the substrate W through the gas flow paths of the through-holes 111c and the through-holes 113c.

An embedded member 114 is arranged in each through-hole 111c of the base 116. Prior to description about the embedded member 114 of the present disclosure, a conventional embedded member 214 will be described with reference to FIG. 3A.

Figure 3A:
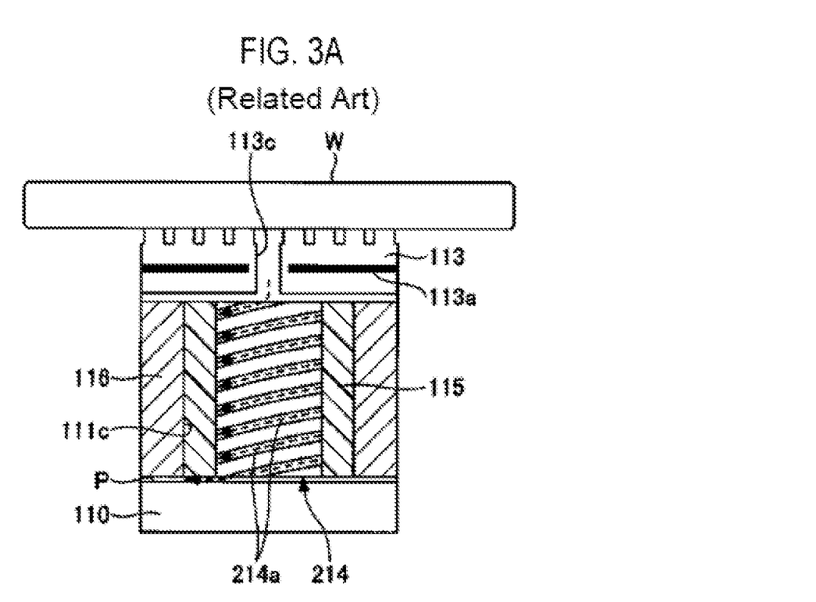
FIG. 3A is a view showing an example of a conventional embedded member.

The conventional embedded member 214 shown in FIG. 3A is arranged inside a ceramics sleeve 115 that covers an inner wall of the through-hole 111c of the base 116. A spiral groove 214a is provided on an outer periphery of the embedded member 214. The groove 214a communicates with the through-hole 113c at an upper end of the embedded member 214 and communicates with the gas flow path P at a lower end of the embedded member 214. The helium gas flows from the gas flow path P through the groove 214a of the embedded member 214 and is supplied between the substrate W and the substrate support surface 111a of the electrostatic chuck 113 through the through-hole 113c.

In recent years, higher RF power has been applied to the substrate supporter 11. In particular, in an etching step of forming a recess having a high aspect in the substrate W, higher RF power is applied for etching. Further, in the substrate supporter 11 having the electrostatic chuck 113, a DC voltage is applied to the electrode 113a during the substrate processing.

A potential difference occurs between the base 116 and the substrate W due to the RF power and the DC voltage applied to the substrate supporter 11. The helium gas flows inside the through-hole 111c and the through-hole 113c and is supplied to the back surface of the substrate W through the interior of the base 116 and the periphery of the electrode 113a.

The sleeve 115 having an insulating property, such as ceramics, is arranged in the through-hole 111c, which is a flow path of the helium gas, so as to suppress electrostatic charging between the base 116 and the substrate W so that electric discharging is prevented. However, when the RF power applied to the base 116 becomes high, the potential difference between the base 116 and the substrate W becomes significant, and therefore, discharging is likely to occur.

Figure 4:
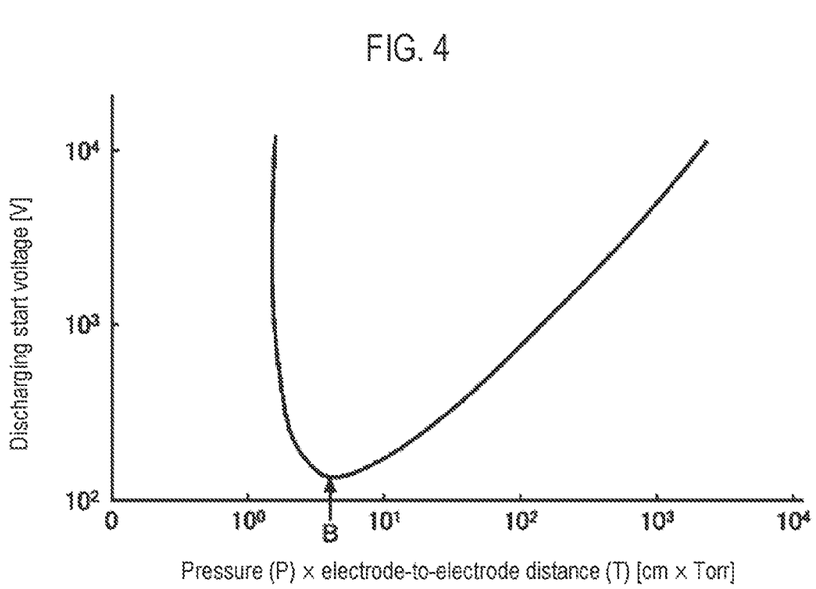
FIG. 4 is a diagram showing an example of Paschen's law.

According to Paschen's law, it is known that it is more difficult to discharge when a gas flow path is lengthened. As shown in FIG. 4, a voltage at which discharging occurs between parallel electrodes is determined by the product of a distance between the electrodes and a gas pressure between the electrodes according to Paschen's law. For example, when the product of the distance between the electrodes and the gas pressure between the electrodes is B, a discharging start voltage is the lowest and the discharging is likely to occur. On the other hand, when the distance between the electrodes, that is, the gas flow path, can be lengthened, the discharging start voltage can become high. That is, by lengthening the gas flow path, it is possible to suppress the occurrence of discharging even if the potential difference between the base 116 and the substrate W becomes significant.

As an example of a method of lengthening the gas flow path, as shown in FIG. 3A, although the embedded member 214 is arranged in the through-hole 111c and the spiral groove 214a is formed on the outer periphery thereof to use the groove 214a as the gas flow path, the discharging suppression effect may not be sufficient. As a result, when a voltage is applied to the substrate supporter 11 while flowing the helium gas through the groove 214a, discharging may occur in the through-hole 113c and its surroundings, resulting in abnormal discharging. This abnormal discharging causes electrical damage to a circuit formed on the substrate W and causes abnormal heat generation to lower the yield.

As a measure to lengthen the gas flow path without changing the size (diameter or length) of the embedded member 214, it is conceivable to narrow a pitch of the groove 214a of the embedded member 214, but this method has a limit in lengthening the gas flow path. On the other hand, if the size of the embedded member 214 is changed to lengthen the gas flow path, structural design changes such as changing the size of the through-hole 111c are required. In contrast, in the embedded member 114 of the present disclosure, the gas flow path can be lengthened without changing the structure of the existing substrate supporter 11.

As a result, as much as the gas flow path is lengthened, the collision frequency of electrons in the plasma that entered the through-holes 113c and 111c can be increased to reduce the energy of the electrons, and the discharging start voltage can be increased according to Paschen's law. That is, by lengthening the gas flow path, it is possible to suppress the occurrence of discharging even if a high voltage is applied to the base 116, thereby preventing abnormal discharging.

[Embedded Member]

Figure 5A:
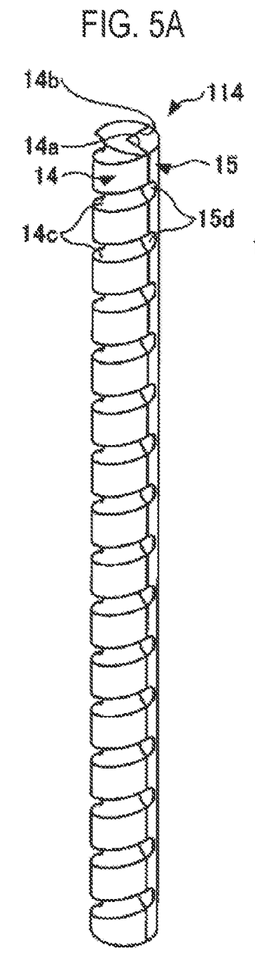
FIGS. 5A to 5D are views showing Example 1 of the embedded member according to the embodiment.

Next, the embedded member 114 according to the embodiment shown in FIG. 3B will be described, and Examples thereof will be described with reference to FIGS. 5A and 6B. FIGS. 5A to 5D show Example 1 of the embedded member 114, and FIGS. 6A and 6B show Example 2 of the embedded member 114.

Figure 3B:
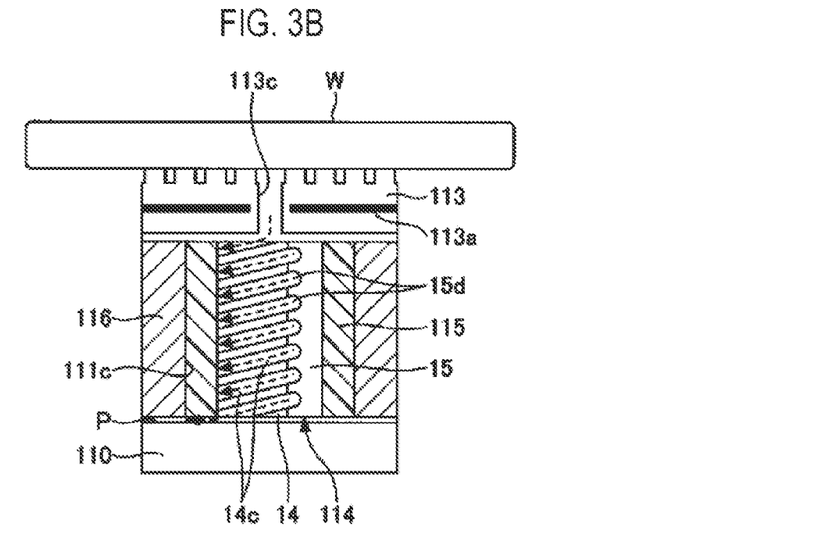
FIG. 3B is a view showing an example of an embedded member according to an embodiment.

The embedded member 114 according to the embodiment shown in FIG. 3B is arranged inside the ceramics sleeve 115 that covers the inner wall of the through-hole 111c of the base 116. The embedded member 114 is arranged inside the sleeve 115 of the through-hole 111c so as not to provide a gap between the sleeve 115 and the embedded member 114. The embedded member 114 is composed of a first member 14 and a second member 15, and these two members are joined (coupled) to each other. An outer flow path 14c is provided on the outer periphery of the first member 14 at a desired pitch. The second member 15 is provided with, for example, inner flow paths 15c and 15d (see FIG. 5B for the inner flow path 15c). A gas flow path formed with the outer flow path 14c and the inner flow paths 15c and 15d communicates with the through-hole 113c at the upper end of the embedded member 114, and communicates with the gas flow path P between the lower surface of the base 116 and the upper surface of the plate 110 at the lower end of the embedded member 114. The helium gas flows from the gas flow path P through the gas flow paths (the outer flow path 14c and the inner flow paths 15c and 15d) of the embedded member 114 and is supplied between the substrate W and the substrate support surface 111a of the electrostatic chuck 113 through the through-hole 113c.

Example 1

The configuration of the embedded member 114 of Example 1 will be described with reference to FIGS. 5A to 5D. The embedded member 114 of Example 1 has substantially a cylindrical shape and is composed of a first member 14 and a second member 15. The first member 14 is formed with one or more outer flow paths 14c on the outer periphery of the first member 14. In the example of FIG. 5A, fifteen outer flow paths 14c are formed on the outer periphery of the first member 14. The second member 15 is formed with two inner flow paths 15c and 15d that are connected to the outer flow paths 14c by joining with the first member 14. The inner flow path 15d connected to the outer flow paths 14c is shown in FIG. 5A. In this way, the outer flow paths 14c and the inner flow paths 15c and 15d communicate with each other.

Figure 5B:
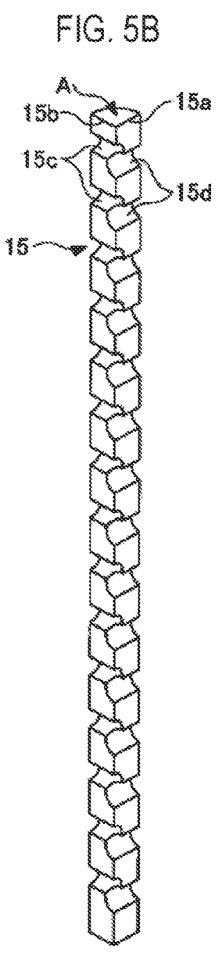
Figure 6A:
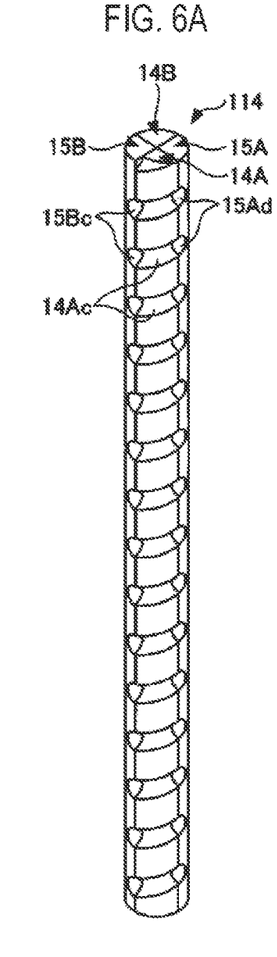
FIGS. 6A and 6B are views showing Example 2 of the embedded member according to the embodiment.
Figure 6B:
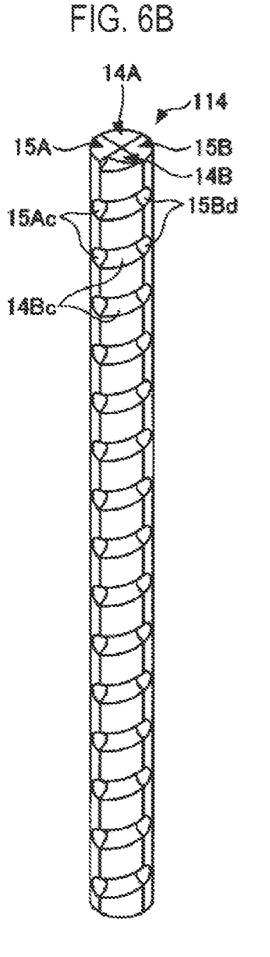

FIG. 5A shows a finished product of the embedded member 114 in which the first member 14 and the second member 15 are joined to each other, and FIG. 5B shows the second member 15 before joining the first member 14 with the second member 15.

As shown in FIG. 5B, the inner flow paths 15c and 15d of the second member 15 are composed of two flow paths communicating with each other, and the two flow paths have the same flow path length. However, the inner flow paths of the second member 15 are not limited thereto, and may be one or more flow paths.

The first member 14 and the second member 15 have the same height. Further, the first member 14 and the second member 15 have sides having the same radius in a plan view with respect to a central axis of the embedded member 114. Therefore, when joined so as to match one side surface 15a of the second member 15 with one side surface 14a of the first member 14 and match the other side surface 15b of the second member 15 and the other side surface 14b of the first member 14, the embedded member 114 having substantially a cylindrical shape is obtained.

The outer flow path 14c is formed on the outer peripheral surface of the first member 14, and one end of the outer flow path 14c communicates with the inner flow path 15d formed on the one side surface 15a of the second member 15. The inner flow path 15d is formed with a groove of the side surface 15a of the second member 15 and the side surface 14a of the first member 14. Similarly, the other end of the outer flow path 14c communicates with the inner flow path 15c formed on the other side surface 15b of the second member 15. The inner flow path 15c is formed with a groove of the side surface 15b of the second member 15 and the side surface 14b of the first member 14.

Heat welding, ultrasonic welding, or the like can be used for joining the first member 14 with the second member 15. The first member 14 and the second member 15 may be bonded by an adhesive. However, the joining between the first member 14 and the second member 15 may not be adhesion. The first member 14 and the second member 15 may be arranged in the through-hole 111c in a state of being joined (coupled) without adhering the first member 14 and the second member 15. Since the second member 15 having the same height as that of the first member 14 is fitted into the first member 14, the assembling property is better than, for example, a case where a plurality of gas flow path members are stacked vertically. Therefore, it is not always necessary to join the first member 14 and the second member 15. Further, since the first member 14 and the second member 15 are exposed to plasma and radicals through the through-hole 113c, they are formed of a plasma-resistant member such as polytetrafluoroethylene (PTFE).

The embedded member 214 shown in FIG. 3A and the embedded member 114 of the present disclosure have the same size (outer shape). However, the gas flow path of the embedded member 114 of the present disclosure is longer than the gas flow path of the embedded member 214 shown by the groove 214a in FIG. 3A. As a result, the discharging start voltage can be increased according to Paschen's law. That is, by lengthening the gas flow path, it is possible to suppress the occurrence of discharging even if a high voltage is applied to the substrate supporter 11. This can prevent the occurrence of abnormal discharging.

[Length of Gas Flow Path]

Figure 5C:
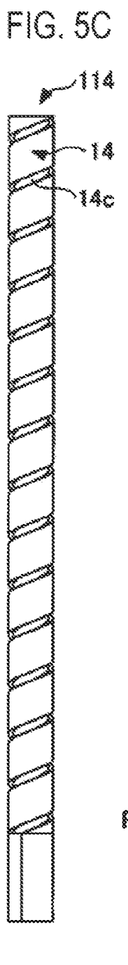
Figure 5D:
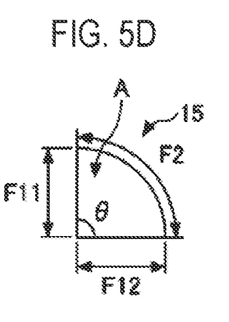

It is proved from the following calculation that the gas flow path of the embedded member 114 is longer than the gas flow path of the embedded member 214. The embedded member 114 used in the calculation is shown in FIG. 5C. The second member 15 is not visible in FIG. 5C. The size of the embedded member 214 is the same as the size of the embedded member 114 shown in FIG. 5C. FIG. 5D shows an upper surface A of the second member 15 of FIG. 5B. As shown in FIG. 5D, the second member 15 has a fan shape having an angle θ of 90° from the central axis of the embedded member 114 when the upper surface A is viewed in a plan view.

In this case, the two flow paths of the inner flow paths 15c and 15d are at right angles to each other. The second member 15 includes the inner flow paths 15c and 15d having the total length of F11 and F12. The outer peripheral length F2 of the second member 15 is ¼ of the length of the one-circumferential groove 214a formed in the embedded member 214. If the total length of F11 and F12 is longer than the length of F2 (=¼ of the length of one circumference of the spiral gas flow path), it can be said that the gas flow path of the embedded member 114 of the present disclosure is longer than the gas flow path of the conventional embedded member 214.

That is, in the embedded member 114 according to the present disclosure, a gas flow path is also formed inside the embedded member 114 by joining the two members. As a result, the length of the gas flow path can be lengthened without changing the size (outer shape) of the embedded member 114 and the pitch of the gas flow path, as compared with a case where the gas flow path is provided only on the outer periphery of the embedded member 114.

Assuming that the lengths (radius) of F11 and F12 of the embedded member 114 are r and the angle about the central axis of the embedded member 114 is θ, the lengths of the inner flow paths 15c and 15d of the second member 15 are 2r. On the other hand, the length of the outer flow path 14c when it is assumed that an outer flow path is provided in the second member 15 is rθ. Therefore, in order for the gas flow path length of the embedded member 114 to be longer than the gas flow path length of the embedded member 214, it is necessary that 2r>rθ is established. That is, θ<2[rad].

Example 2

In the embedded member 114 of Example 1, one first member 14 and one second member 15 are provided and joined. In contrast, as shown in FIGS. 6A and 6B, in an embedded member 114 of Example 2, two first members 14 and two second members 15 are provided and alternately joined so as to be adjacent to each other. As shown in FIGS. 6A and 6B, the two first members 14 are indicated by first members 14A and 14B, and the two second members 15 are indicated by second members 15A and 15B. The first member 14A in the front of the embedded member 114 of FIG. 6A is shown in the back in the embedded member 114 of FIG. 6B, and the first member 14B in the front of the embedded member 114 of FIG. 6B is shown in the back in the embedded member 114 in FIG. 6A.

The first members 14A and 14B and the second members 15A and 15B are provided so that the first member 14 and the second member 15 are alternately adjacent to each other. The second members 15A and 15B are provided with two flow paths, respectively, and a total of four flow paths communicate with each other. One flow path 15Ad of the two flow paths formed in the second member 15A and one flow path 15Bc of the two flow paths formed in the second member 15B are shown in FIG. 6A. The other flow path 15Ac of the two flow paths formed in the second member 15A and the other flow path 15Bd of the two flow paths formed in the second member 15B are shown in FIG. 6B.

The central angles of the first members 14A and 14B and the second members 15A and 15B may all be 90°, the angles of the second members 15A and 15B may be smaller than 90°, and the angles of the first members 14A and 14B may be larger than 90°. The angles of the second members 15A and 15B may be the same angle or different angles. The angles of the first members 14A and 14B may be the same angle or different angles. In the case of Example 2, the two flow paths of the inner flow paths 15Ac and 15Ad of the second member 15A communicate with each other, and the two flow paths of the inner flow paths 15Bc and 15Bd of the second member 15B communicate with each other. The four flow paths are arranged in a relationship of 90° or less with each other. When the central angles of the second members 15A and 15B are 90°, the four flow paths are arranged in a relationship of 90° with each other.

By changing the number of divisions of the embedded member 114 and the angle θ at the time of division, the gas flow path can be lengthened without increasing the size of the embedded member 114. This makes it possible to prevent the occurrence of abnormal discharging.

Other Examples

Figures 7A, 7B, 7C:
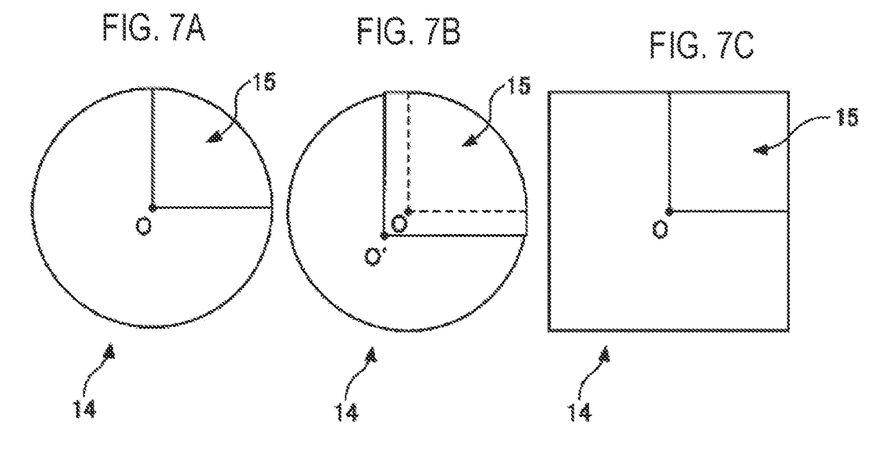
FIGS. 7A to 7C are views showing another Example of the embedded member according to the embodiment.

Other Examples of the embedded member 114 according to the embodiment will be described with reference to FIGS. 7A to 7C. FIG. 7A shows the upper surface of the embedded member 114 of Example 1 described above. A corner portion of the joint portion between the first member 14 and the second member 15 is located at the center O of a circle on the upper surface of the embedded member 114.

FIGS. 7B and 7C show other Examples of the embedded member 114. In the example of FIG. 7B, a corner portion of the joint portion of the first member 14 and the second member 15 is located at a position O' shifted from the center O of a circle. In this way, the first member 14 and the second member 15 do not have to be divided by the center O of the circle on the upper surface of the embedded member 114. In FIG. 7B, the position O' is shifted to the first member 14 side from the center O of the circle, but without being limited thereto, the position O' may be shifted to the second member 15 side from the center O of the circle.

The shape of the embedded member 114 when the first member 14 and the second member 15 are coupled is not limited to substantially a cylindrical shape, but may be another shape such as substantially a rectangular shape. In the example of FIG. 7C, the embedded member 114 has a rectangular parallelepiped shape, the shape of the upper surface thereof is a square, and a corner portion of the joint portion of the first member 14 and the second member 15 is located at the center O of the square. However, the present disclosure is not limited thereto. For example, the shape of the upper surface of the embedded member 114 may be rectangular or polygonal, and even in that case, the corner portion of the joint portion of the first member 14 and the second member 15 may be located at the center O, or may be located at a position shifted from the center O.

Others

In Examples 1 and 2, the description has been made on the premise that the heights (lengths in the longitudinal direction) of the first member 14 and the second member 15 are the same, but the present disclosure is not limited thereto. For example, the length of the second member 15 may be shorter than the length of the first member 14. In this case, the second member 15 is joined to a recess of the length of the first member 14, which is provided in a portion of the first member in the longitudinal direction.

Further, although the example where the first member 14 has the outer flow paths 14c and the second member 15 has the inner flow paths 15c and 15d has been described, the first member 14 may have not only the outer flow paths 14c, but also inner flow paths at a position facing the inner flow paths 15c and 15d of the second member 15. In this case, the inner flow paths are completed by assembling the inner flow paths 15c and 15d of the second member 15 and the inner flow paths at the corresponding position of the first member 14 so as to face each other. Further, in this case, the inner flow paths 15c and 15d of the second member 15 may not be provided.

Further, the second member 15 may have not only the inner flow paths 15c and 15d, but also outer flow paths at a position connected to the outer flow paths 14c of the first member 14.

Further, the example in which the embedded member 114 is provided in the substrate supporter 11 has been described, but the present disclosure is not limited thereto. For example, the embedded member 114 may be provided in the gas flow path of the shower head 13. Since the shower head 13 also functions as an upper electrode, the shower head 13 is an example of a member having an electrode to which a desired high frequency power is applied. As the electrode included in the shower head 13, a conductive member of the shower head 13 to which the RF signal (RF power) is coupled from the first RF generator 31a may be used as the electrode (upper electrode). By providing the embedded member 114 in the gas flow path of the shower head 13, the gas flow path can be lengthened. This makes it possible to prevent abnormal discharging from occurring when a voltage is applied to the shower head 13.

As described above, according to the plasma processing apparatus and the substrate supporter of the present embodiment, it is possible to lengthen the gas flow path length without changing the size of the embedded member 114.

The plasma processing apparatus 1 and the substrate supporter 1I according to the embodiments disclosed herein should be considered to be exemplary and not restrictive in all respects. The embodiments may be modified and improved in various forms without departing from the appended claims and the gist thereof. The matters described in the aforementioned embodiments may have other configurations to the extent that they are not contradictory, and may be combined to the extent that they are not contradictory.

The plasma processing apparatus of the present disclosure is applicable to any types of apparatuses including an atomic layer deposition (ALD) apparatus, a capacitively-coupled plasma (CCP) apparatus, an inductively-coupled plasma (ICP) apparatus, a radial line slot antenna (RLSA), an electron cyclotron resonance plasma (ECR) apparatus, and a helicon wave plasma (HWP) apparatus.

According to the present disclosure in some embodiments, it is possible to increase a gas flow path length of a gas flow path member without changing the size of an arrangement region of the gas flow path member.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
a process container;
an electrode arranged inside the process container and applied with desired high frequency power;
a member having the electrode; and
an embedded member arranged in the member,
wherein the embedded member is composed of:
a first member formed with one or more outer flow paths on an outer periphery of the embedded member; and
a second member formed with one or more inner flow paths connected to the one or more outer flow paths by joining with the first member, and
wherein the one or more outer flow paths and the one or more inner flow paths communicate with each other.

2. The plasma processing apparatus of claim 1, wherein a flow path length of the one or more inner flow paths of the second member is longer than a flow path length of flow paths provided on the outer periphery of the second member and connected to the one or more outer flow paths of the first member, instead of providing the one or more inner flow paths in the second member.

3. The plasma processing apparatus of claim 2, wherein the flow path length of the one or more inner flow paths of the second member is $4/\pi$ times the flow path length of the one or more outer flow paths when the one or more outer flow paths are provided in the second member.

4. The plasma processing apparatus of claim 3, wherein the one or more inner flow paths are composed of two or more flow paths communicating with each other, and
wherein the two or more flow paths have a same flow path length.

5. The plasma processing apparatus of claim 4, wherein the two or more flow paths are arranged at right angles to each other.

6. The plasma processing apparatus of claim 1, wherein the one or more inner flow paths are composed of two or more flow paths communicating with each other, and
wherein the two or more flow paths have a same flow path length.

7. A substrate supporter comprising:
an electrode applied with desired high frequency power;
a member having the electrode; and
an embedded member arranged in a through-hole provided in the member,
wherein the embedded member is composed of:
a first member formed with one or more outer flow paths on an outer periphery of the embedded member; and a second member formed with one or more inner flow paths connected to the one or more outer flow paths by joining with the first member, and wherein the one or more outer flow paths and the one or more inner flow paths communicate with each other.

* * * * *